(12) United States Patent
Ashikhmin

(10) Patent No.: US 9,762,262 B2
(45) Date of Patent: Sep. 12, 2017

(54) HARDWARE-EFFICIENT SYNDROME EXTRACTION FOR ENTANGLED QUANTUM STATES

(71) Applicant: Alcatel-Lucent USA Inc., Murray Hill, NJ (US)

(72) Inventor: Alexei Ashikhmin, Morristown, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 418 days.

(21) Appl. No.: 14/541,779

(22) Filed: Nov. 14, 2014

(65) Prior Publication Data

US 2016/0112066 A1    Apr. 21, 2016

Related U.S. Application Data

(60) Provisional application No. 62/013,770, filed on Jun. 18, 2014.

(51) Int. Cl.
  *H03M 13/15*     (2006.01)
  *G06N 99/00*     (2010.01)
  *H03M 13/00*     (2006.01)

(52) U.S. Cl.
  CPC ...... *H03M 13/1575* (2013.01); *G06N 99/002* (2013.01); *H03M 13/005* (2013.01); *H03M 13/154* (2013.01)

(58) Field of Classification Search
  CPC .................................................. H03M 13/151
  (Continued)

(56) References Cited

U.S. PATENT DOCUMENTS 4,775,979 A    10/1988  Oka
5,768,297 A     6/1998  Shor
(Continued)

FOREIGN PATENT DOCUMENTS

WO    WO2014113226 A1    7/2014

OTHER PUBLICATIONS

Nielsen, Michael A., et al., "Quantum Computation and Quantum Information, Quantum error-correction," Quantum Computation and Quantum Information, Campridge University Press, UK, pp. 425-499.
(Continued)

*Primary Examiner* — Fritz Alphonse
(74) *Attorney, Agent, or Firm* — Mendelsohn Dunleavy, P.C.; Yuri Gruzdkov

(57) ABSTRACT

A quantum-state-refresh module of a memory system is configured to detect an error in an entangled qubit state stored therein by performing a redundant measurement of syndrome values corresponding to a quantum stabilizer code, with the redundant measurement being based on a block error-correction code. The quantum-state-refresh module includes a plurality of measurement sub-modules, each configured to measure a respective syndrome value or a respective parity value corresponding to the entangled qubit state. The total number of the measurement sub-modules is smaller than the codeword length of the block error-correction code, and the initial approximation of the punctured syndrome values is replaced in the decoding process by erasure values. With the block error-correction code appropriately constructed for the use of erasure values, the quantum-state-refresh module is advantageously capable of providing reliable error detection with fewer quantum gates than that used for the full-length measurement of the codeword.

20 Claims, 6 Drawing Sheets

(58) Field of Classification Search
USPC .......................................... 714/785, 758, 806
See application file for complete search history.

(56) References Cited

U.S. PATENT DOCUMENTS

| | | | |
|---|---|---|---|
| 5,844,920 A * | 12/1998 | Zook | G11B 5/012 360/51 |
| 5,944,848 A * | 8/1999 | Huang | H03M 13/151 714/756 |
| 6,678,450 B1 | 1/2004 | Franson | |
| 6,732,325 B1 * | 5/2004 | Tash | H03M 13/15 714/785 |
| 7,251,769 B2 | 7/2007 | Ashikhmin et al. | |
| 7,373,581 B2 | 5/2008 | Okamura et al. | |
| 7,519,898 B2 | 4/2009 | Narayanan et al. | |
| 7,583,438 B2 | 9/2009 | Tomita | |
| 7,676,734 B2 | 3/2010 | Yamagishi | |
| 7,732,804 B2 | 6/2010 | Hollenberg et al. | |
| 7,751,491 B2 | 7/2010 | Li et al. | |
| 7,793,201 B1 | 9/2010 | Ulriksson | |
| 7,805,654 B2 | 9/2010 | Seki | |
| 7,875,876 B1 | 1/2011 | Wandzura et al. | |
| 7,966,549 B2 | 6/2011 | Hollenberg et al. | |
| 8,223,414 B2 | 7/2012 | Goto et al. | |
| 8,327,215 B2 | 12/2012 | Yoon et al. | |
| 8,510,618 B1 | 8/2013 | Pesetski et al. | |
| 2004/0000666 A1 | 1/2004 | Lidar et al. | |
| 2006/0101236 A1 | 5/2006 | Han | |
| 2007/0126436 A1 | 6/2007 | Hannah | |
| 2008/0185576 A1 | 8/2008 | Hollenberg et al. | |
| 2008/0237579 A1 | 10/2008 | Barker et al. | |
| 2009/0213444 A1 | 8/2009 | Goto et al. | |
| 2010/0251049 A1 | 9/2010 | Goto et al. | |
| 2013/0088224 A1 | 4/2013 | Koizumi | |
| 2013/0107617 A1 | 5/2013 | Skold et al. | |
| 2014/0201591 A1 | 7/2014 | Ashikhmin | |

OTHER PUBLICATIONS

Gilbert G., et al., "Logical zeros for the seven-qubit quantum error correction code," Proceedings of SPIE—International Society for Optical Engineering, US, Jun. 3, 2011, vol. 8057, pp. 80570d-1 to 80570d-6.
Rieffel, E., et al., "An Introduction to Quantum Computing for Non-physicists," ACM Computing Surveys, NY, Jan. 19, 2000, pp. 1-45.
Gottesman, Daniel, "An Introduction to Quantum Error Correction and Fault-Tolerant Quantum Computation," Arxiv.org, Cornell University Library, 201 Olin Library Cornell University Ithaca, NY 14853, 2009 (46 pages).
International Search Report and Written Opinion; Mailed Dec. 3, 2015 for PCT Application No. PCT/US15/33875 (15 pages).
Ruffer, B. S., et al., "On robust stability of the belief propagation algorithm for LDPC decoding," In Proc. 19th Int. Symp.Study of Mathematical Theory of Networks and Systems, 2010 [4], pp. 1-6.
Ezhov, A. A., et al., "Quantum associative memory with distributed queries, Information Sciences," vol. 128, Issues 3-4, Oct. 1, 2000, pp. 271-293, Retrieved from: (http://www.sciencedirect.com/science/article/pii/S0020025500000578).
Steane, A. M., et al., "Error Correcting codes in Quantum Theory", APS Journals, Physical Review Letter, vol. 77, No. 5, pp. 793-797 (1996).
DiVincenzo, D. P., et al., "Fault-Tolerant Error Correction with Efficient Quantum Codes," APS Journals, Physical Review Letter, vol. 77, No. 15, pp. 3260-3263.
Barenco, A., et al., "Elementary gates for quantum computation," APS Journals, A Physical Review, vol. 52, No. 5., Nov. 1995, pp. 3457-3467.
Preskill, J., "Reliable Quantum Computer," Proceeding from Royal Society, London, 1998, vol. 454, pp. 385-410.
Muthukrishnan, A., "Classical and Quantum Logic Gates: An Introduction to Quantum Computing," Quantum Information Seminar, Rochester Center for Quantum Information, Sep. 1999, pp. 1-22.
Kielpinski, D., "A Small Trapped-Ion Quantum Register," Institute of Physics Publishing, Journal of Optics B: Quantum and Semiclassical Optics, vol. 5, 2003, R121-R135.
Van Meter, R. D., III, "Architecture of a Quantum Multicomputer Optimized for Shor',s Factoring Algorithm," PhD dissertation, Keio Univ., 2006, pp. i-239.
Kok, P., et al., "Linear Optical Quantum Computing with Photonic Qubits," APS Journals, Reviews of Modern Physics, vol. 79, No. 1, pp. 135-174 (2007).
Li, R., et al., "Robust High-Fidelity Universal Set of Quantum Gates Through Non-Adiabatic Rapid Passage," Journal of Modern Optics, vol. 00, No. 00, Jan. 2010, pp. 1-8.
Valiron, B., "Quantum computation: a tutorial," New Generation Computing, 2012, pp. 1-30.
Wootton, J. R., "Quantum Memories and Error Correction," Tutorial Review, Journal of Modern Optics, vol. 59, No. 20, Nov. 2012, pp. 1717-1738.
"Quantum Error Correction," Chapter 7, http://www.theory.caltech.edu/people/preskill/ph229/, 1999 [Retrieved on May 28, 2013]. Retrieved from the Internet: <URL:http://www.theory.caltech.edu/people/preskill/ph229/notes/chap7.pdf> (92 pages).
Decoding methods—Wikipedia, the free encyclopedia, http://en.wikipedia.org/wiki/Decoding_methods, May 1, 2012, 5 pgs.
Quantum computer—Wikipedia, the free encyclopedia, http://en.wikipedia.org/wiki/Quantum_computer, Jan. 11, 2013, 24 pgs.
Quantum error correction—Wikipedia, the free encyclopedia, http://en.wikipedia.org/wiki/Quantum_error_correction, Nov. 20, 2012, 6 pgs.
Quantum gate—Wikipedia, the free encyclopedia, http://en.wikipedia.org/wiki/Quantum_gate, Jan. 13, 2013, 7 pgs.
Stabilizer code—Wikipedia, the free encyclopedia, http://en.wikipedia.org/wiki/Stabilizer_code, Nov. 26, 2012, 5 pgs.
Gaitan, Frank, Quantum Error Correction and Fault Tolerant Quantum Computing, CRC Press, 2008, Florida, pp. vii-292.
Nielsen, Michael A. et al., Quantum Computation and Quantum Information, Cambridge University Press, 2000, UK, pp. vii-676.
Liu, K., et al., "Optimization of LDGM-based quantum codes using Density Evolution," 48th Allerton Annual Conference on Communication, Control, and Computing, Illinois (US), 2010, IEEE, Sep. 29, 2010, pp. 881-886.
International Search Report and Written Opinion; Mailed Sep. 29, 2014 for corresponding PCT Application No. PCT/US2014/041216.
Ezhov, A. A., et al., "Quantum Associative Memory With Distributed Queries," 2000, pp. 1-19, Retrieved from: (http//www.sciencedirect.com/science/article/pii/S0020025500000578).
Ashikhmin, A., "Syndrome of Degraded Quantum Redundancy Code States," U.S. Appl. No. 13/912,876 as filed on Jun. 7, 2013, pp. 1-38.
Ashikhmin, A., "Error Correction for Entangled Quantum States," U.S. Appl. No. 13/912,654 as filed on Jun. 7, 2013, pp. 1-34.

* cited by examiner

100

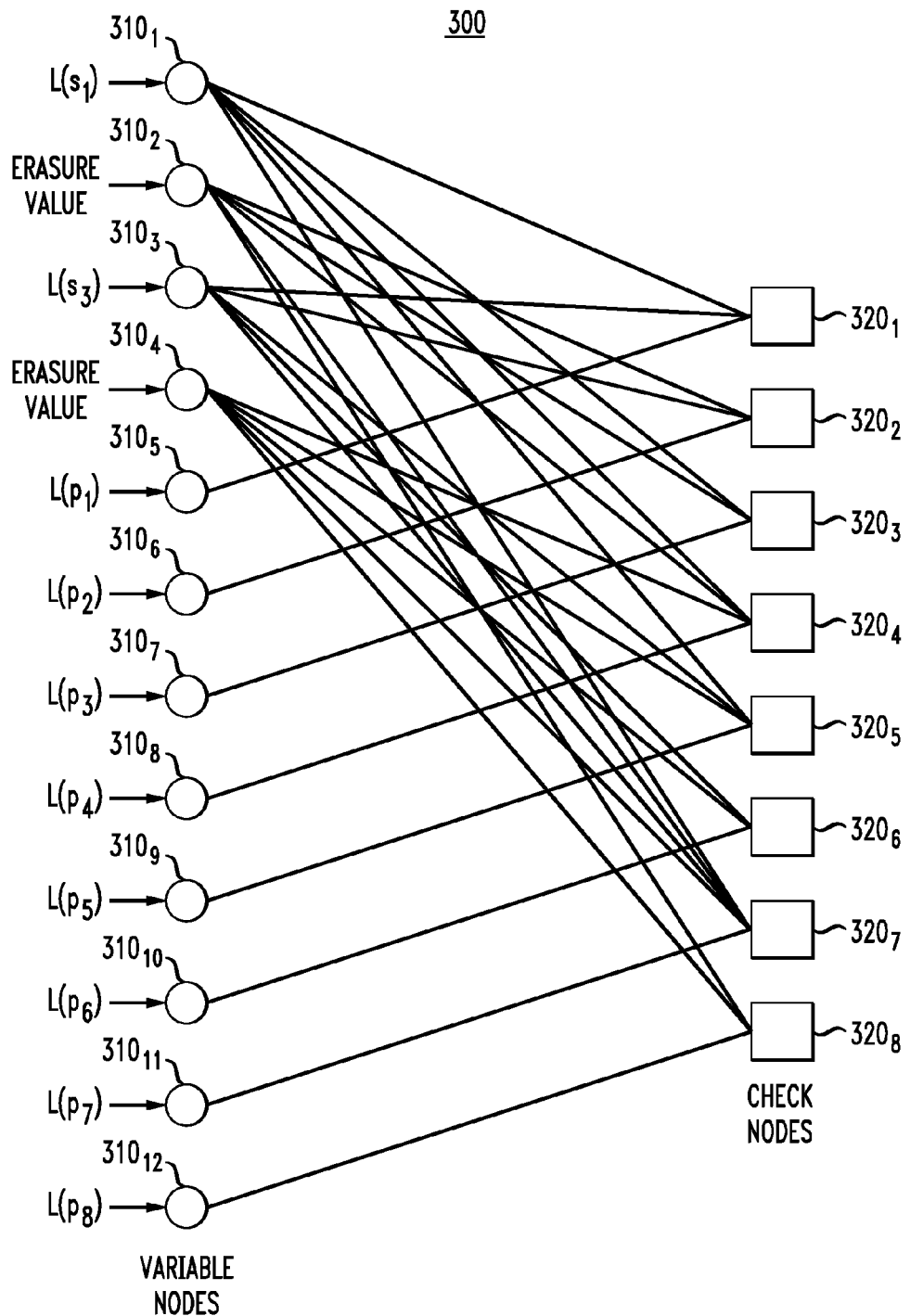

HARDWARE-EFFICIENT SYNDROME EXTRACTION FOR ENTANGLED QUANTUM STATES

CROSS-REFERENCE TO RELATED APPLICATIONS

This application claims priority from U.S. Provisional Patent Application No. 62/013,770 filed Jun. 18, 2014, and entitled "HARDWARE-EFFICIENT SYNDROME EXTRACTION FOR ENTANGLED QUANTUM STATES," which is incorporated herein by reference in its entirety.

BACKGROUND

Field

The present disclosure relates to error correction.

Description of the Related Art

This section introduces aspects that may help facilitate a better understanding of the disclosure. Accordingly, the statements of this section are to be read in this light and are not to be understood as admissions about what is in the prior art or what is not in the prior art.

A quantum memory is a device that is configured to store and read a quantum state. Such a device can be based on, e.g., quantum dots, rare-earth ions in a solid, nitrogen-vacancy centers in diamond, trapped ions, optical pulses with a low photon count, fractional quantum Hall liquids, or any other suitable quantum-mechanical system. Some applications rely on a quantum memory to store quantum states with sufficiently high fidelity for a relatively long time. However, the quantum state or ensemble of quantum states may exhibit a relatively high rate of loss of fidelity, e.g., due to decoherence and/or processing in quantum-gate devices.

SUMMARY OF SOME SPECIFIC EMBODIMENTS

Disclosed herein are various embodiments of a memory system comprising a qubit array configured to store therein and read one or more entangled qubit states encoded using a quantum stabilizer code. The quantum-memory system further comprises a quantum-state-refresh module configured to change an entangled qubit state in the qubit array when an error is detected therein. The quantum-state-refresh module is configured to detect an error in the entangled qubit state under test by performing a redundant measurement of a set of syndrome values corresponding to the quantum stabilizer code, with the redundant measurement being based on a block error-correction code. In an example embodiment, the quantum-state-refresh module includes a plurality of measurement sub-modules, each configured to measure a respective syndrome value or a respective parity value corresponding to the entangled qubit state under test. The total number of the measurement sub-modules is smaller than the codeword length of the block error-correction code, and the initial approximation of the syndrome values that are not measured by the measurement sub-modules is replaced in the decoding process by a set of erasure values. With the block error-correction code appropriately constructed for the use of erasure values, the quantum-state-refresh module is advantageously capable of providing reliable error detection with fewer quantum gates than that used for the full-length measurement of the codeword.

According to one embodiment, provided is an apparatus comprising: a register configured to store a coded entangled qubit state generated using a quantum stabilizer code; a measurement circuit configured to perform a redundant measurement of a set of syndrome values corresponding to the coded entangled qubit state, wherein the redundant measurement is performed based on a block error-correction code; an erasure-value generator configured to generate a set of erasure values; and a decoder configured to determine a probable syndrome vector corresponding to the coded entangled qubit state using the block error-correction code and the redundant measurement of the set of syndrome values, and further configured to apply the set of erasure values generated by the erasure-value generator to a set of variable nodes not configured to receive a measured syndrome value from the measurement circuit.

According to another embodiment, provided is a method of mitigating loss of fidelity of coded entangled qubit states stored in a memory system, the method comprising the steps of: performing a redundant measurement of a set of syndrome values corresponding to a coded entangled qubit state generated using a quantum stabilizer code, wherein the redundant measurement is performed using a measurement circuit corresponding to a block error-correction code; and determining a probable syndrome vector corresponding to the coded entangled qubit state using the block error-correction code and the redundant measurement of the set of syndrome values. The step of determining comprises applying a set of erasure values to a set of variable nodes not configured to receive a measured syndrome value from the measurement circuit.

BRIEF DESCRIPTION OF THE DRAWINGS

Other aspects, features, and benefits of various disclosed embodiments will become more fully apparent, by way of example, from the following detailed description and the accompanying drawings, in which:

FIG. 3 shows a bipartite graph corresponding to a message-passing decoding algorithm that can be used in the memory system of FIG. 1 according to an embodiment of the disclosure.

DETAILED DESCRIPTION

Patent application Ser. No. 13/912,654 filed on Jun. 7, 2013 by Alexei Ashikhmin and entitled "ERROR CORRECTION FOR ENTANGLED QUANTUM STATES" is incorporated herein by reference in its entirety.

Figure 1:
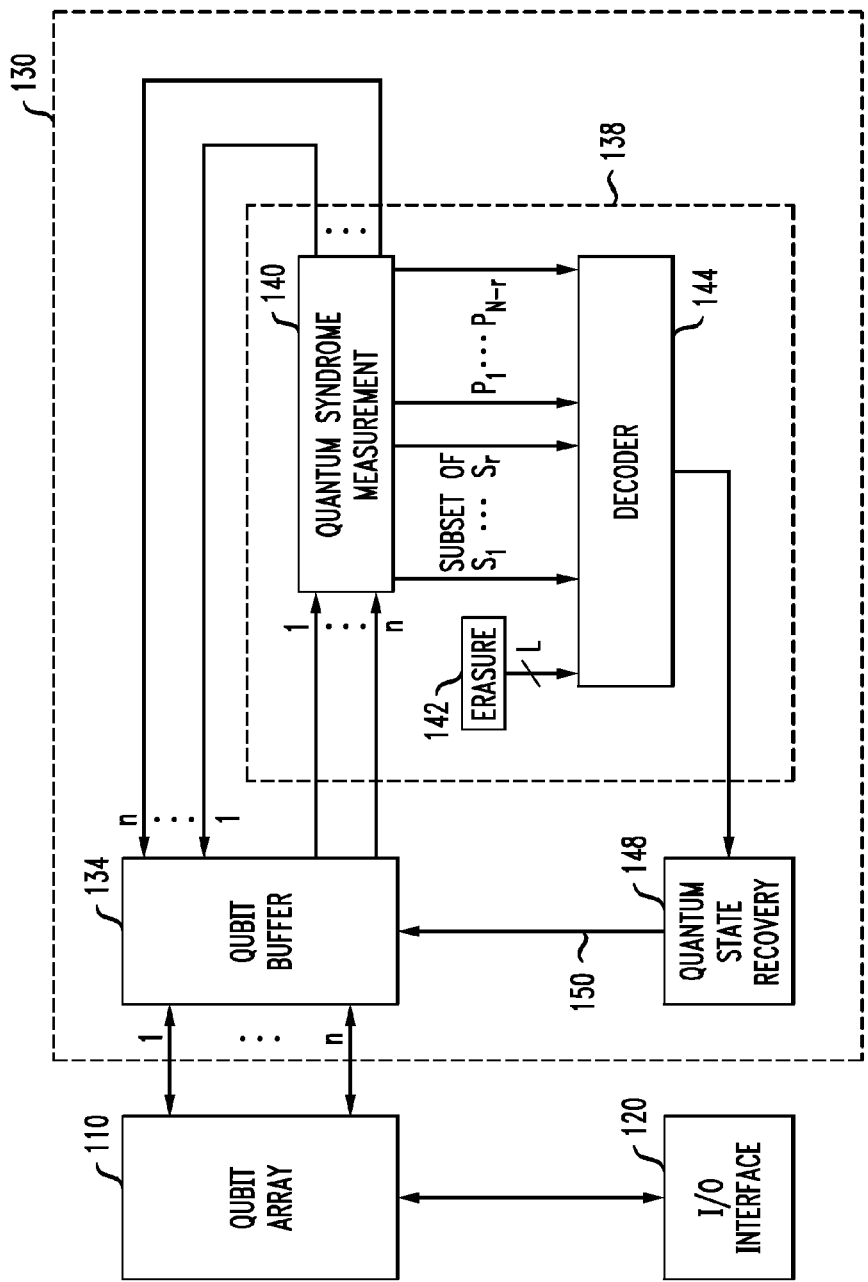
FIG. 1 shows a block diagram of a memory system according to an embodiment of the disclosure.

FIG. 1 shows a block diagram of a memory system 100 according to an embodiment of the disclosure. Memory system 100 comprises a qubit array 110 configured to store therein one or more quantum states. The quantum states can be written into and read out of qubit array 110 via an input/output (I/O) interface 120. Memory system 100 further comprises a qubit-state-refresh (QSR) module 130 that operates to effectively protect the quantum states stored in qubit array 110 from accumulating errors, thereby enabling memory system 100 to store quantum states with relatively high fidelity for a relatively long time.

As used herein, the term "qubit" refers to a memory element or cell that comprises a two-state quantum-mechanical system. Examples of suitable two-state quantum-mechanical systems include, but are not limited to: (i) two spin states of a particle having a spin of ½; (ii) the ground and excited states of an atom; (iii) two polarization states of a single photon, and (iv) edge states of a FQHE (fractional quantum Hall effect) liquid droplet. Various additional embodiments of a qubit that can be used to implement qubit array 110 are disclosed, e.g., in U.S. Pat. No. 7,732,804 and U.S. Patent Application Publication Nos. 2004/0000666 and 2013/0107617, all of which are incorporated herein by reference in their entirety.

The two states with respect to which the state of a qubit can be measured are referred to as the basis states. A non-entangled qubit state is a linear superposition of the basis states. Multi-qubit states differ from classical multi-bit states in that the former can be formed to exhibit entanglement. An entangled qubit state cannot be decomposed into a simple product of single-qubit basis states, but rather, it can be expressed as a linear combination or superposition of different products of single-qubit basis states. QSR module 130 is configured to use the entangled nature of a multi-qubit state, e.g., as further detailed below, to effectively protect qubit array 110 from accumulating errors in the qubit states therein.

According to some embodiments, each entangled qubit state stored in qubit array 110 is encoded using a quantum stabilizer code, Q. A quantum stabilizer code Q of length n and dimension k operates on a linear subspace of dimension $2^k$ in the complex space $S^D$, where $D=2^n$. One representation of the quantum stabilizer code Q is a group G of cardinality $|G|=2^r$ (where $r=n-k$). The group has r generators, wherein each generator is a binary vector $g=(g_1, g_2, \ldots, g_{2n-1}, g_{2n})$ of 2n bits. Herein, the 2n bits of such a binary vector are grouped into n pairs of bits. Any two vectors g from group G satisfy the following constraint:

if g, g'∈G, then g*g'=0, where the "*" sign denotes the symplectic inner product of binary vectors g and g', which mixes the corresponding bit pairs of vectors g and g'. For example, the following four binary vectors may represent a quantum stabilizer code Q of length n=5 and dimension k=1:

$g_1$=(10 01 01 10 00)

$g_2$=(10 00 10 01 01)

$g_3$=(00 10 01 01 10)

$g_4$=(01 10 00 10 01)          (1)

The weight of vector g, denoted wt(g), is the number of nonzero bit pairs $g_{2t-1}$, $g_{2t}$ therein, where $t=1, \ldots, n$. In particular, such a pair of bits ($g_{2t-1}$, $g_{2t}$) is nonzero as long as at least one of $g_{2t-1}$ and $g_{2t}$ is nonzero. Eq. (2) gives a corresponding mathematical expression for wt(g):

$wt(g)=|\{g_{2t-1},g_{2t}\neq(0,0), t=1, \ldots, n\}|$          (2)

where |x| denotes the cardinality of set x. For example, the weight of vector $g_1$ defined by Eqs. (1) is four (i.e., $wt(g_1)$=4) because only one of the five bit pairs in $g_1$ is 00.

Vector g is referred to as a "sparse" vector if its weight wt(g) is small (e.g., <10%) compared to the vector's length n. For example, vector g=(00 00 00 00 00 00 00 11 00 00 00 00 00 00 00 00 00 01 00 00 00 00 00 00 00 00 00 00 01 00 00 00 00 00 00) is sparse because its weigh wt(g) (=3) is much smaller than its length n (=33). If group G consists of r sparse vectors $g_1, g_2, \ldots, g_r$, then group G represents a quantum LDPC (low-density parity-check) code. In some embodiments, memory system 100 is configured to store, read, and write entangled quantum states that have been generated using a quantum LDPC code.

In operation, QSR module 130 is configured to serially subject to processing the different entangled quantum states stored in qubit array 110. The sets of qubits corresponding to different entangled quantum states may be transferred to QSR module 130, one set at a time, based on a preset schedule, e.g., in a round-robin sequence. QSR module 130 is further configured to subject each received set of qubits to error-correction processing, e.g., as further described below.

In an example embodiment, the error-correction processing in QSR module 130 includes the steps of: (i) determining whether or not the received set of qubits corresponding to an entangled quantum state has an error, and (ii) if an error is detected, then changing the qubit state to correct the detected error. The set of qubits, now in a changed and presumably error-free entangled quantum state, is then transferred back to qubit array 110. If QSR module 130 does not detect an error in the qubit state, then the corresponding entangled quantum state is presumed to be error-free, and the qubit set can be transferred back to qubit array 110 without changes to its qubit state.

In an example embodiment, QSR module 130 comprises a qubit buffer 134, an error-detection circuit 138, and a quantum-state recovery circuit 148 interconnected as indicated in FIG. 1. Qubit buffer 134 comprises one or more qubit registers configured to hold the received qubits for the duration of the corresponding error-correction processing. Error-detection circuit 138 is configured to implement the above-specified step (i) of the error-correction processing. Quantum-state recovery circuit 148 is configured to act on the entangled quantum state in qubit buffer 134 to implement the above-specified step (ii) of the error-correction processing.

In an example embodiment, error-detection circuit 138 includes a syndrome-measurement circuit 140, an erasure-value generator 142, and a decoder 144 coupled to each other and to other circuits in QSR module 130 as indicated in FIG. 1.

Syndrome-measurement circuit 140 is a quantum circuit configured to perform a redundant measurement, on the encoded entangled quantum state in qubit buffer 134, of a set of syndrome values. The encoded entangled quantum state under measurement has been initially generated using the quantum stabilizer code Q. The result of the redundant measurement performed by syndrome-measurement circuit 140 is a binary vector $v_{sub}$ comprising N−L binary values, where L is a positive integer smaller than r. Vector $v_{sub}$ is a sub-vector of binary vector $v=(s_1, \ldots, s_r, p_1, \ldots, p_{N-r})$ comprising N binary values. Vector v has the following structure: (i) the first r binary values ($s_1, \ldots, s_r$) in vector v are the syndrome bits corresponding to the quantum stabilizer code Q; and (ii) the next N−r binary values ($p_1, \ldots, P_{N-r}$) in vector v are the parity bits that can be used to guard against possible errors in the measurement of the syndrome bits. In the absence of errors, for each encoded entangled quantum state generated using the quantum stabilizer code Q, the corresponding binary vector v is a codeword of a block error-correction code C used in conjunction with the quantum stabilizer code Q. In an example embodiment, the block error-correction code C has a rate of r/N. A specific example of the block error-correction code C is described in more detail below in reference to Eqs. (3)-(5).

As indicated above, vector $v_{sub}$ differs from vector v in that it contains fewer binary values. As a result, syndrome-measurement circuit 140 can be implemented using fewer quantum gates than a syndrome-measurement circuit configured to measure vector v, an example of which is disclosed in the above-cited U.S. patent application Ser. No. 13/912,654. In particular, in an example embodiment, instead of the r binary values representing the full set of syndrome bits ($s_1, \ldots, s_r$), syndrome-measurement circuit 140 is configured to generate r–L binary values representing a subset of the full set of syndrome bits ($s_1, \ldots, s_r$). These r–L binary values are the first r–L components of vector $v_{sub}$. The next N–r binary values in vector $v_{sub}$ represent parity bits ($p_1, \ldots, p_{N-r}$) and are the same as in vector v.

Decoder 144 is configured to process the measured vector $v_{sub}$ in accordance with the block error-correction code C to determine the most probable valid codeword corresponding to the measured vector $v_{sub}$. Note that a message-passing decoding algorithm that is used in decoder 144 in an example embodiment thereof conventionally receives, as an initial input, N binary values. These N binary values are typically used to initialize the variable nodes of the bipartite graph corresponding to the block error-correction code C. However, the measured vector $v_{sub}$ provided by syndrome-measurement circuit 140 to decoder 144 has only N–L binary values. Erasure-value generator 142 operates to generate L additional binary values, termed "erasure values," and provide these L additional binary values to decoder 144 to complement the measured vector $v_{sub}$. Decoder 144 then uses the N–L binary values of vector $v_{sub}$, received from syndrome-measurement circuit 140 and the L values received from erasure-value generator 142 to initialize the variable nodes of the bipartite graph corresponding to the block error-correction code C, e.g., as further explained below in reference to FIG. 3.

After receiving the N binary values from syndrome-measurement circuit 140 and erasure-value generator 142, decoder 144 is configured to process these N binary values in accordance with the block error-correction code C to determine the most probable valid codeword corresponding to the received input. Representative examples of such processing according to an embodiment of the disclosure are described in more detail below in reference to FIGS. 3 and 4. Additional examples of such processing according to various alternative embodiments are disclosed in U.S. patent application Ser. No. 13/912,876 filed by Alexei Ashikhmin on Jun. 7, 2013, and entitled "SYNDROME OF DEGRADED QUANTUM REDUNDANCY CODED STATES," which is incorporated herein by reference in its entirety. After such processing, decoder 144 truncates the determined most probable codeword by removing the N–r parity bits and passes the remaining r most probable values of syndrome bits $s_1, \ldots, s_r$ to quantum-state recovery circuit 148.

Quantum-state recovery circuit 148 uses the syndrome values $s_1, \ldots, s_r$ received from decoder 144 to correct an error (if any) in the entangled quantum state stored in qubit buffer 134. More specifically, if the syndrome values $s_1, \ldots, s_r$ received from decoder 144 are all zeros, then the entangled quantum state in qubit buffer 134 is presumed to be error-free, and no error correction is performed on it by quantum-state recovery circuit 148. However, if any of the syndrome values $s_1, \ldots, s_r$ received from decoder 144 is not a zero, then the entangled quantum state in qubit buffer 134 is presumed to have an error. In this case, quantum-state recovery circuit 148 uses the syndrome values $s_1, \ldots, s_r$ received from decoder 144 to determine the most probable error operator E that has caused the corresponding original entangled quantum state to transform into the entangled quantum state that returned these syndrome values. The book by Frank Gaitan, entitled "Quantum Error Correction and Fault Tolerant Quantum Computing," Taylor & Francis, 2008, discloses suitable algorithms that can be used for this determination in quantum-state recovery circuit 148 according to an embodiment of the disclosure. This book by Frank Gaitan is incorporated herein by reference in its entirety. In alternative embodiments, other suitable algorithms for the determination of error operator E based on syndrome values $s_1, \ldots, s_r$ of quantum stabilizer code Q can also be used.

In one embodiment, error operator E may be represented as a square complex-valued matrix. To correct the error corresponding to error operator E, quantum-state recovery circuit 148 is first configured to find an inverse of error operator E, e.g., using a suitable conventional matrix-inversion algorithm. The resulting inverted matrix is denoted $E^{-1}$. Based on $E^{-1}$, quantum-state recovery circuit 148 is then configured to generate a stimulus 150 that changes the entangled quantum state held in qubit buffer 134 in a manner that corrects the error caused by error operator E. If the error correction is performed properly, then the corrected entangled quantum state in qubit buffer 134 will most probably have an all-zero syndrome set $s_1, \ldots, s_r$.

For illustration purposes and without any implied limitation, the subsequent description of some embodiments is given with reference to an example of the block error-correction code C having the following generator matrix G(C):

$$G(C) = \begin{bmatrix} 1 & 0 & 0 & 0 & 1 & 0 & 1 & 1 & 1 & 0 & 1 & 0 \\ 0 & 1 & 0 & 0 & 0 & 1 & 1 & 1 & 0 & 0 & 1 & 1 \\ 0 & 0 & 1 & 0 & 1 & 1 & 0 & 0 & 1 & 1 & 1 & 0 \\ 0 & 0 & 0 & 1 & 0 & 0 & 0 & 1 & 1 & 1 & 1 & 1 \end{bmatrix} \quad (3)$$

This block error-correction code is a code example for which r=4 and N=12. An example embodiment of syndrome-measurement circuit 140 corresponding to this block error-correction code C may be designed for L=2 and configured to generate a vector $v_{sub}=(s_1, s_3, p_1, \ldots, p_8)$ (also see FIG. 2A). For comparison, the corresponding full-length vector v is expressed as $v=(s_1, s_2, s_3, s_4, p_1, \ldots, p_8)$. As can be seen, syndrome values $s_2$ and $s_4$ are not present in vector $v_{sub}$. Theoretically, vector $v_{sub}=(s_1, s_3, p_1, \ldots, p_8)$ can be considered as having been generated by puncturing vector $v=(s_1, s_2, s_3, s_4, p_1, \ldots, p_8)$ at two (because L=2) appropriately selected positions. Accordingly, syndrome values $s_2$ and $s_4$ can be referred to as "punctured" syndrome values. As will be clear from the subsequent description, the circuit structure of syndrome-measurement circuit 140 determines which of the full set of syndrome bits ($s_1, \ldots, s_r$) are punctured and not measured in the syndrome-measurement circuit.

Note that generator matrix G(C), as given by Eq. (3), has the form of $G(C)=[I_4|P]$, where $I_4$ is a 4×4 identity matrix, and P is an r×(N–r) binary matrix corresponding to the block error-correction code C. Matrix P is hereafter referred to as the parity-bit generator sub-matrix. The parity-check matrix, H(C), corresponding to this form of generator matrix G(C) has the form of $H(C)=[P^T|I_{N-r}]$, where $I_{N-r}$ is an (N–r)×(N–r) identity matrix, and $P^T$ is P transposed. The parity-check matrix H(C) corresponding to the generator matrix G(C) given by Eq. (3) is given by Eq. (4):

$$H(C) = \begin{bmatrix} 1 & 0 & 1 & 0 & 1 & 0 & 0 & 0 & 0 & 0 & 0 & 0 \\ 0 & 1 & 1 & 0 & 0 & 1 & 0 & 0 & 0 & 0 & 0 & 0 \\ 1 & 1 & 0 & 0 & 0 & 0 & 1 & 0 & 0 & 0 & 0 & 0 \\ 1 & 1 & 0 & 1 & 0 & 0 & 0 & 1 & 0 & 0 & 0 & 0 \\ 1 & 0 & 1 & 1 & 0 & 0 & 0 & 0 & 1 & 0 & 0 & 0 \\ 0 & 0 & 1 & 1 & 0 & 0 & 0 & 0 & 0 & 1 & 0 & 0 \\ 1 & 1 & 1 & 1 & 0 & 0 & 0 & 0 & 0 & 0 & 1 & 0 \\ 0 & 1 & 0 & 1 & 0 & 0 & 0 & 0 & 0 & 0 & 0 & 1 \end{bmatrix} \quad (4)$$

This parity-check matrix H(C) causes the parity bits $p_1, \ldots, p_8$ of vector $v_{sub}$ generated by syndrome-measurement circuit 140 to have the following relationship with the syndrome bits $S_1, S_2, S_3, S_4$:

$$p_1 = s_1 + s_3$$

$$p_2 = s_2 + s_3$$

$$p_3 = s_1 + s_2$$

$$p_4 = s_1 + s_2 + s_4$$

$$p_5 = s_1 + s_3 + s_4$$

$$p_6 = s_3 + s_4$$

$$p_7 = s_1 + s_2 + s_3 + s_4$$

$$p_8 = s_2 + s_4 \quad (5)$$

Note that all summations in Eqs. (5) are performed by modulo 2.

Figure 2A:
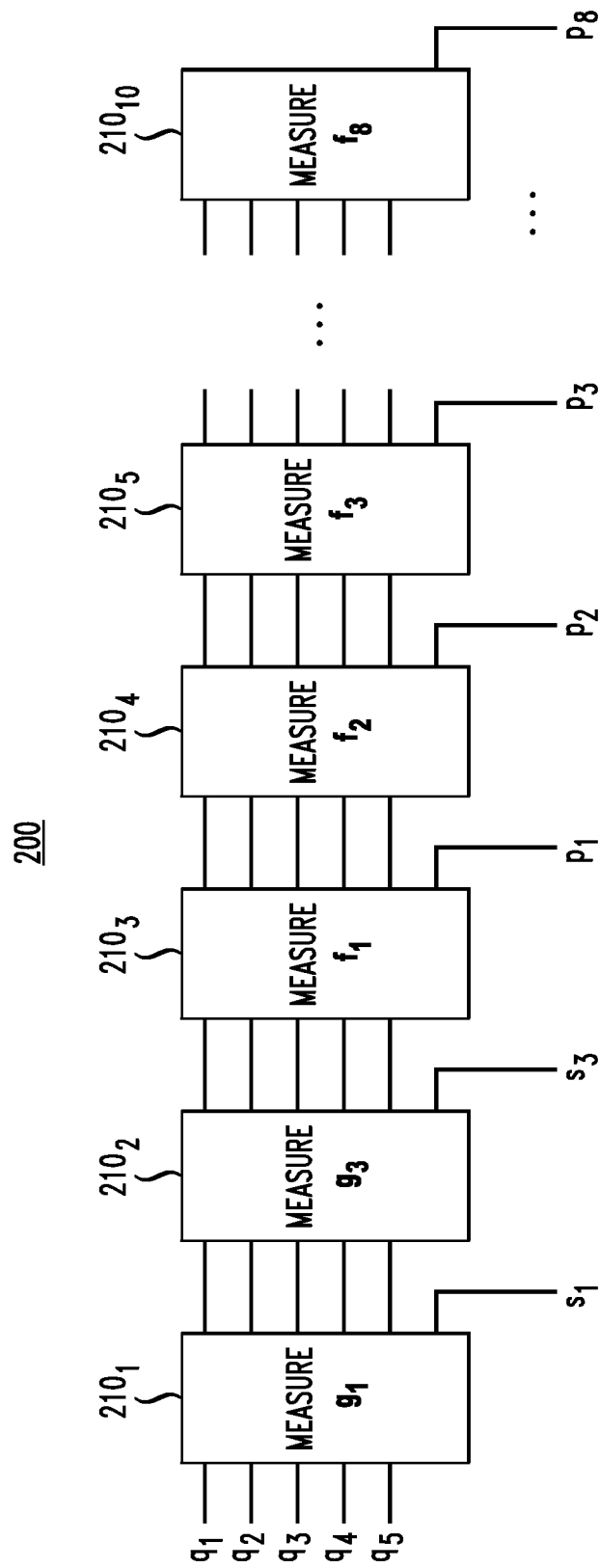
FIGS. 2A-2C show block diagrams of a syndrome-measurement circuit that can be used in the memory system of FIG. 1 according to an embodiment of the disclosure.
Figure 2B:
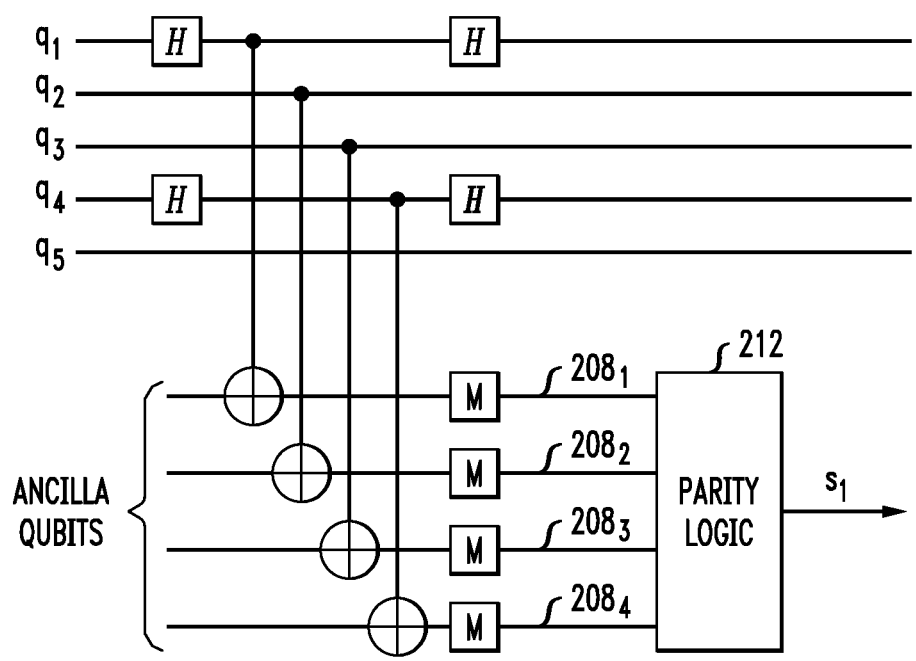
Figure 2C:
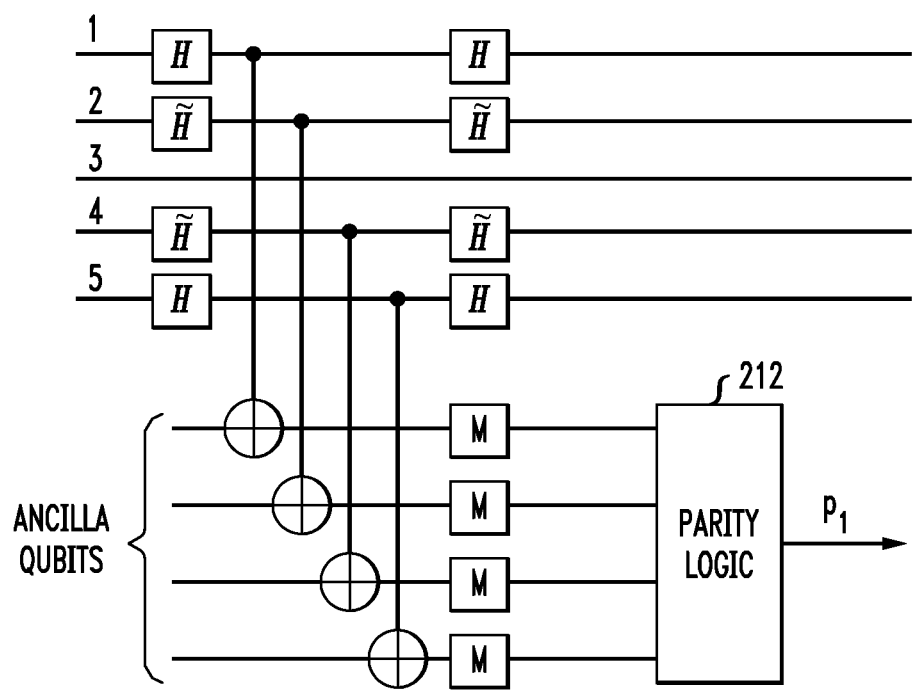

FIGS. 2A-2C show block diagrams of a syndrome-measurement circuit 200 that can be used as syndrome-measurement circuit 140 (FIG. 1) according to an embodiment of the disclosure. More specifically, FIG. 2A shows an overall block diagram of syndrome-measurement circuit 200. FIG. 2B shows a block diagram of a module $210_1$ in circuit 200 configured to measure the value of syndrome bit $s_1$. FIG. 2C shows a block diagram of a module $210_3$ in circuit 200 configured to measure the value of parity bit $p_1$. Based on the block diagrams shown in FIGS. 2B and 2C and the corresponding description provided below, one of ordinary skill in the art will be able to construct block diagrams for each of the remaining eight modules 210 in circuit 200. Syndrome-measurement circuit 200 is designed to perform measurements in accordance with the block error-correction code C having the generator matrix G(C) given by Eq. (3).

Referring to FIG. 2A, syndrome-measurement circuit 200 is configured to perform a syndrome measurement for an entangled quantum state encoded in qubits $q_1$-$q_5$. This measurement is performed by generating vector $v_{sub} = (s_1, s_3, p_1, \ldots, p_8)$. Each component of vector $v_{sub}$ is generated by a corresponding one of measurement modules $210_1$-$210_{10}$, wherein measurement modules $210_1$ and $210_2$ are configured to generate vector components $s_1$ and $s_3$, respectively, and measurement modules $210_3$-$210_{10}$ are configured to generate vector components $p_1$-$p_8$, respectively. Syndrome bits $s_2$ and $s_4$ are the punctured bits because syndrome-measurement circuit 200 does not have measurement modules 210 configured to measure the values of either $s_2$ or $s_4$.

Measurement modules $210_1$ and $210_2$ are configured to generate syndrome values $s_1$ and $s_3$ by performing a respective measurement on the entangled quantum state of qubits $q_1$-$q_5$, which measurement is based on a respective one of the binary vectors g representing quantum stabilizer code Q. For the embodiment shown in FIGS. 2A-2C, these binary vectors are vectors $g_1$-$f_4$ given by Eqs. (1). Measurement module $210_1$ is configured to perform a measurement on the entangled quantum state of qubits $q_1$-$q_5$ based on binary vector $g_1$. Measurement module $210_2$ is similarly configured to perform a measurement on the entangled quantum state of qubits $q_1$-$q_5$ based on binary vector $g_3$.

Each of measurement modules $210_3$-$210_{10}$ is configured to generate a respective one of parity values $p_1$-$p_8$ by performing a measurement on the entangled quantum state of qubits $q_1$-$q_5$, which measurement is based on a respective one of binary vectors $f_1$-$f_8$. The binary vectors $f_1$-$f_8$ are generated, based on the parity checks implemented in the block error-correction code C as the corresponding linear combinations of the binary vectors g representing quantum stabilizer code Q. For example, for the block error-correction code C having the generator matrix G(C) given by Eq. (3), binary vectors $f_1$-$f_8$ are expressed by Eqs. (6) as follows:

$$f_1 = g_1 + g_3$$

$$f_2 = g_2 + g_3$$

$$f_3 = g_1 + g_2$$

$$f_4 = g_1 + g_2 + g_4$$

$$f_5 = g_1 + g_3 + g_4$$

$$f_6 = g_3 + g_4$$

$$f_7 = g_1 + g_2 + g_3 + g_4 \quad (6)$$

Also note the similarity between Eqs. (5) and (6).

FIG. 2B shows a block diagram of measurement module $210_1$ according to an embodiment of the disclosure. Measurement module $210_1$ is an example of a measurement module configured to generate a syndrome value for vector $v_{sub}$. More specifically, measurement module $210_1$ is configured to measure a state formed by coupling the entangled quantum state of qubits $q_1$-$q_5$ to a reference state of ancilla qubits based on a coupling defined by the binary vector $g_1$, (10 01 01 10 00) of the above-described quantum stabilizer code Q (see Eqs. (1)). The ancilla qubits are reference qubits that are prepared, as known in the art, to be in a particular preselected quantum state.

Measurement module $210_1$ comprises four quantum Hadamard gates H or $\tilde{H}$, four quantum CNOT gates ⊕, and four quantum measurement gates M, all arranged as shown in FIG. 2B. One of ordinary skill in the art will recognize that quantum Hadamard gates, quantum CNOT gates, and quantum measurement gates are elementary quantum gates from the universal quantum-gate set, which is conventionally used in the construction of quantum circuits. Descriptions of such elementary quantum gates can be found, e.g., in (i) A. Barenco, et al., "Elementary Gates for Quantum Computation," Physical Review A, 1995, v. 52, pp. 3457-3467; (ii) the book by Goong Chen, et al., "QUANTUM COMPUTING DEVICES: PRINCIPLES, DESIGNS, AND ANALYSIS," CRC Press, 2007; and (iii) the book by M. Nielsen and I. Chuang, "Quantum Computation and Quantum Information," Cambridge University Press, 2000, all of which are incorporated herein by reference in their entirety. Additional description of quantum Hadamard gates and quantum CNOT gates can be found, e.g., in the above-cited book by Frank Gaitan and the above-cited U.S. patent application Ser. No. 13/912,876 by Alexei Ashikhmin.

The first bit pair in $g_1$ is 10. Accordingly, measurement module $210_1$ is configured to couple qubit $q_1$ and an ancilla qubit via a Hadamard gate and a CNOT gate. The second bit pair in $g_1$ is 01. Accordingly, measurement module $210_1$ is configured to couple qubit $q_2$ and an ancilla qubit via a CNOT gate, while no Hadamard gate is used. The third bit pair in $g_1$ is again 01. Accordingly, measurement module $210_1$ is configured to couple qubit $q_3$ and an ancilla qubit in a manner similar to that of qubit $q_2$. The fourth bit pair in $g_1$ is again 01. Accordingly, measurement module $210_1$ is configured to couple qubit $q_4$ and an ancilla qubit in a manner similar to that of qubit $q_1$. The fifth bit pair in $g_1$ is 00. Accordingly, measurement module $210_1$ does not couple qubit $q_5$ and an ancilla qubit.

Each quantum measurement gate M in measurement module $210_1$ is configured to (i) measure the qubit state applied to its input port (located at the left side of the gate in FIG. 2B) and (ii) based on the measurement, generate a corresponding electrical output signal $208_i$ (i=1, 2, 3, 4) at its output port (located at the right side of the gate in FIG. 2B). Each quantum measurement gate M then applies electrical output signal $208_i$ to a parity logic circuit 212 connected to receive electrical output signals $208_1$-$208_4$.

In one embodiment, parity logic circuit 212 is configured to slice each of signals $208_1$-$208_4$, thereby converting each of them into a respective binary value (0 or 1). Parity logic circuit 212 is further configured to output (i) a binary "zero" if the number of zeros generated from signals $208_1$-$208_4$ is even, and (ii) a binary "one" if the number of zeros generated from signals $208_1$-$208_4$ is odd. In effect, the latter function of parity logic circuit 212 is the same as that of a conventional four-input exclusive-OR (XOR) gate.

In an alternative embodiment, parity logic circuit 212 includes a soft-output detector (not explicitly shown in FIG. 2B). More specifically, in this embodiment, instead of converting signals $208_1$-$208_4$ into a "hard" binary value (0 or 1) for syndrome bit $s_1$, parity logic circuit 212 uses the soft-output detector to convert signals $208_1$-$208_4$ into a log-likelihood-ratio (LLR) value representing syndrome bit $s_1$. In an example embodiment, an LLR value comprises (i) a sign bit that represents the detector's best guess regarding the hard value of syndrome bit $s_1$ and (ii) one or more magnitude bits that represent the detector's confidence in the hard value. For example, parity logic circuit 212 may be configured to output a five-bit LLR value, where the most-significant bit is the sign bit and the four least-significant bits are the confidence bits. By way of example and without limitation, a five-bit LLR value of 00000 indicates a hard value of 0 with minimum confidence, while a five-bit LLR value of 01111 indicates a hard value of 0 with maximum confidence. Intermediate values (e.g., between 0000 and 1111) of confidence bits represent intermediate confidence levels. Similarly, a five-bit LLR value of 10001 indicates a hard value of 1 with minimum confidence, while a five-bit LLR value of 11111 indicates a hard decision of 1 with maximum confidence, wherein the binary value of 10000 is usually unused. Other numbers of bits and other representations of confidence levels may alternatively be used as well.

In one embodiment, the soft-output detector in parity logic circuit 212 is configured to generate four intermediate LLR values, each based on a respective one of signals $208_1$-$208_4$. Parity logic circuit 212 then processes these four intermediate LLR values, e.g., using a soft-input/soft-output (SISO) XOR gate, thereby converting them into the corresponding LLR value representing syndrome bit $s_1$.

In general, an intermediate LLR value generated by the soft-output detector in parity logic circuit 212 depends on the type and number of quantum gates in the corresponding qubit-measurement path. For example, the qubit-measurement path for qubit $q_1$ includes three quantum gates, i.e., a quantum Hadamard gate H, a quantum CNOT gate $\oplus$, and a quantum measurement gate M. As a result, the corresponding probability of an erroneous measurement corresponding to qubit $q_1$ ($P_{err}(q_1)$) can be expressed using the probabilities of errors in the three individual quantum gates within the $q_1$-measurement path, e.g., as follows:

$$P_{err}(q_1) \approx 1-(1-p_H) \times (1-p_{CNOT}) \times (1-p_M) \quad (7)$$

where $p_H$, $p_{CNOT}$, $p_M$ are the probabilities of errors in the quantum Hadamard gate H, the quantum CNOT gate $\oplus$, and the quantum measurement gate M, respectively, in the $q_1$-measurement path. In one embodiment, the soft-output detector in parity logic circuit 212 can be configured to convert this probability of error, as known in the art, into the confidence bits of the LLR value corresponding to signal $208_1$.

As another example, the qubit-measurement path for qubit $q_2$ includes two quantum gates, i.e., a quantum CNOT gate $\oplus$ and a quantum measurement gate M. As a result, the corresponding probability of an erroneous measurement corresponding to qubit $q_2$ ($P_{err}(q_2)$) can be expressed using the probabilities of errors in these two individual quantum gates. The soft-output detector in parity logic circuit 212 can similarly be configured to convert this particular probability of error into the confidence bits of the LLR value corresponding to signal $208_2$.

Eq. (8) gives an approximate expression for the probability ($P_{err}(g_1)$) that measurement module $210_1$ generates an erroneous hard value of syndrome bit $s_1$:

$$P_{err}(g_1) \approx 1-(1-p_{qg})^{3wt(g_1)} \quad (8)$$

where $p_{qg}$ is the average probability of error in an individual quantum gate (of any type) in measurement module $210_1$; and $wt(g_1)$ is the weight of binary vector $g_1$, i.e., the binary vector of the above-described quantum stabilizer code Q corresponding to the measurement performed in measurement module $210_1$. In one embodiment, parity logic circuit 212 can be configured to generate confidence bits of the LLR value representing syndrome bit $s_1$ based on Eq. (8), rather than based on the above-mentioned processing of intermediate LLR values in a SISO XOR gate.

FIG. 2C shows a block diagram of measurement module $210_3$ according to an embodiment of the disclosure. Measurement module $210_3$ is an example of a measurement module configured to generate a parity bit value for vector $v_{sub}$. More specifically, measurement module $210_3$ is configured to measure a state formed by coupling the entangled quantum state of qubits $q_1$-$q_5$ to a reference state of ancilla qubits based on a coupling defined by binary vector $f_1$=(10 11 00 11 10) (see Eqs. (6)).

The first bit pair in $f_1$ is 10. Accordingly, measurement module $210_3$ is configured to couple qubit $q_1$ and an ancilla qubit via a Hadamard gate and a CNOT gate. The second bit pair in $f_1$ is 11. Accordingly, measurement module $210_3$ is configured to couple qubit $q_2$ and an ancilla qubit via a Hadamard gate $\tilde{H}$ and a CNOT gate. The third bit pair in $f_1$ is 00. Accordingly, measurement module $210_3$ does not couple qubit $q_3$ and an ancilla qubit. The fourth bit pair in $f_1$ is again 11. Accordingly, measurement module $210_3$ is configured to couple qubit $q_4$ and an ancilla qubit in a manner similar to that of qubit $q_2$. The fifth bit pair in $f_1$ is 10. Accordingly, measurement module $210_5$ is configured to couple qubit $q_5$ and an ancilla qubit in a manner similar to that of qubit $q_1$. The quantum measurement gates M and parity logic circuit 212 in measurement module $210_5$ operate similar to those in measurement module $210_1$ (FIG. 2B).

One of ordinary skill in the art will understand how to construct appropriate expressions for $P_{err}(q_k)$ (where k=1, 2, ..., 5) and $P_{err}(f_1)$ for a soft-output embodiment of parity logic circuit 212 in measurement module $210_3$, e.g., using Eqs. (7) and (8), respectively, as examples. One of ordinary skill in the art will further understand that the expressions for the probability of error corresponding to different measurement modules $210_j$ (j=1, 2, ..., 10) may also depend on the type and number of quantum gates placed on the respective qubit lines in the upstream quantum circuits. For example, the expressions for the probability of error corresponding to measurement module $210_3$ may depend on the type and number of quantum gates placed on the respective qubit lines in measurement modules $210_1$ and $210_2$. The expressions for the probability of error corresponding to measurement module $210_5$ (see FIG. 2A) may depend on the type and number of quantum gates placed on the respective qubit lines in measurement modules $210_1$ through $210_4$, etc.

Additional details on how to construct measurement modules $210_1$-$210_{10}$ based on the operative quantum stabilizer code Q and block error-correction code C according to various alternative embodiments can be found, e.g., in the above-cited U.S. patent application Ser. No. 13/912,876 by Alexei Ashikhmin.

FIG. 3 shows a bipartite graph 300 corresponding to a message-passing decoding algorithm that can be used in decoder 144 (FIG. 1) according to an embodiment of the disclosure. More specifically, bipartite graph 300 corresponds to the example parity-check matrix H(C) given by Eq. (4). As such, a message-passing decoding algorithm based on bipartite graph 300 can be used to process vector $v_{sub}$=($s_1$, $s_3$, $p_1$, ..., $p_8$) generated by syndrome-measurement circuit 200 (FIG. 2A).

Since the block error-correction code C defined by Eqs. (3)-(4) corresponds to r=4 and N=12, bipartite graph 300 has twelve (because N=12) variable nodes $310_1$-$310_{12}$ and eight (because N−r=8) check nodes $320_1$-$320_8$. The plurality of edges that connect variable nodes $310_1$-$310_{12}$ and check nodes $320_1$-$320_8$ in bipartite graph 300 have the topology defined by Eqs. (5) or (6). At the start of the decoding process, variable nodes $310_1$, $310_3$, and $310_5$-$310_{12}$ are initialized, e.g., as indicated in FIG. 3, by receiving the LLR values generated by syndrome-measurement circuit 144 (FIG. 1) or 200 (FIG. 2A) in the process of measuring vector $v_{sub}$. Variable nodes $310_2$ and $310_4$, which correspond to the punctured syndrome bits $s_2$ and $s_4$, are initialized using the two (because L=2) erasure values supplied by erasure-value generator 142 (FIG. 1). In an example embodiment, an erasure value supplied by erasure-value generator 142 has the same binary format as the LLR values applied to variable nodes $310_1$, $310_3$, and $310_5$-$310_{12}$ by the syndrome-measurement circuit. For example, an erasure value may comprise (i) a zero sign bit and (ii) a plurality of magnitude bits whose value expresses a 50% confidence in the zero value of the sign bit. In other words, the erasure value is selected to express the fact that there is a virtually complete uncertainty, for decoding purposes, as to whether the correct value of each punctured syndrome bit is a "zero" or a "one" because the punctured syndrome bits have not been directly measured. Mathematically, this virtual uncertainty can be expressed, e.g., as a 50% confidence that the correct value of the punctured syndrome bit is "zero" or, alternatively, as a 50% confidence that the correct value of the punctured syndrome bit is "one."

Further description of the example decoding process corresponding to bipartite graph 300 is given below in reference to FIG. 4.

Figure 4:
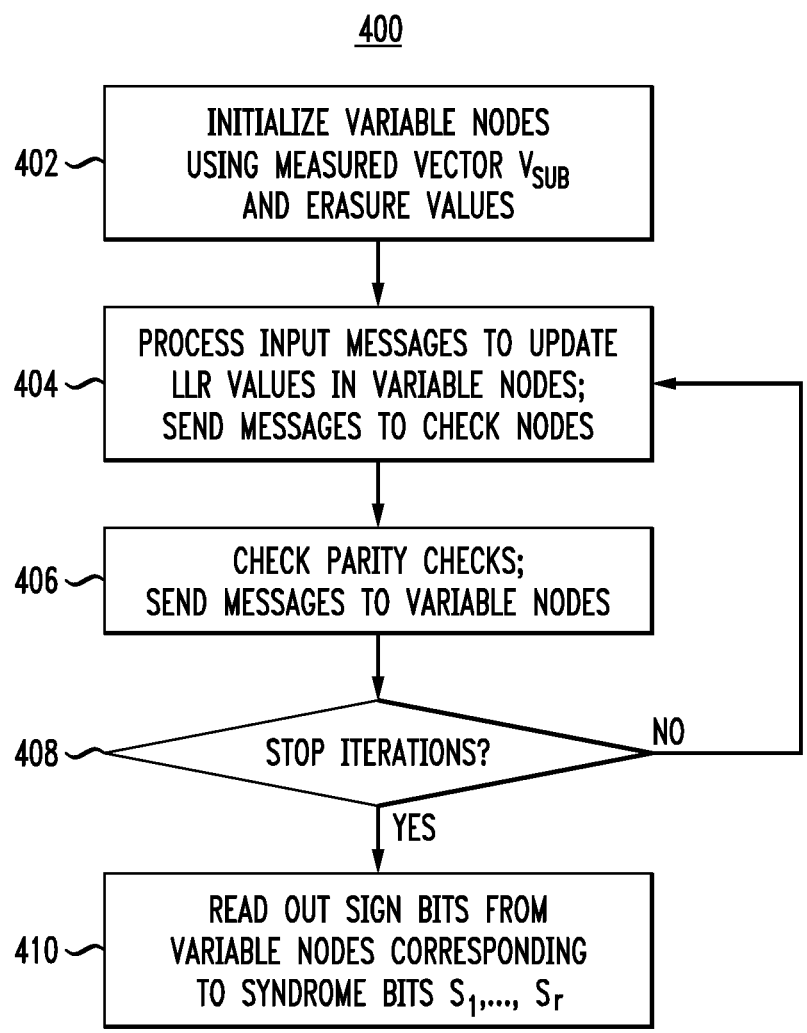
FIG. 4 shows a flowchart of a decoding method that can be used in the memory system of FIG. 1 according to an embodiment of the disclosure.

FIG. 4 illustrates a decoding method 400 that can be used in decoder 144 (FIG. 1) according to an embodiment of the disclosure. Method 400 can be used in an embodiment of decoder 144 configured to receive (i) vector $v_{sub}$, whose components are LLR values generated, e.g., as described above, by respective parity logic circuits 212 in measurement modules 210 of syndrome-measurement circuit 200 (see FIGS. 2A-2C) and (ii) erasure values generated, e.g., as described above, by erasure-value generator 142 (FIG. 1). Based on the provided description, one of ordinary skill in the art will understand how to modify decoding method 400 for an alternative embodiment compatible with a different block error-correction code C, a different quantum stabilizer code Q, and/or a different number L of punctured syndrome bits.

Method 400 is directed at computing the a posteriori probability that a given bit $c_i$ in codeword c=($c_1$, $c_2$, $c_3$, $c_N$) of length N of the block error-correction code C equals 1 (or 0) based on the particular vector $v_{sub}$ received from syndrome-measurement circuit 200 (FIG. 2A). The corresponding LLR value, $L(c_i)$, is given by Eq. (9):

$$L(c_i)=\log(Pr(c_i=0|v)/Pr(c_i=1|v)) \qquad (9)$$

where Pr( ) denotes the a posteriori probability for the condition in the parentheses ( ). Method 400 relies on an iterative message-passing decoding algorithm based on a bipartite graph of the block error-correction code C, e.g., bipartite graph 300 (FIG. 3). According to this algorithm, the variable nodes in the bipartite graph represent processors of one type; the check nodes in the bipartite graph represent processors of another type; and the edges between the variable and check nodes represent message paths.

At step 402 of method 400, the variable nodes of the bipartite graph are initialized, e.g., as indicated in FIG. 3, by receiving the LLR values generated by syndrome-measurement 200 (FIG. 2A) in the process of measuring vector $v_{sub}$ corresponding to an entangled quantum state held in qubit buffer 134 (FIG. 1) and further receiving the L erasure values generated by erasure-value generator 142 (FIG. 1).

At step 404, each processor of a variable node in the bipartite graph processes its input messages received via the corresponding message paths from the respective check nodes. Note that, in the first occurrence of step 404, when no messages are yet received from the check nodes, the received initial values of step 402 are used instead of the input messages. Based on the received input messages, each of the processors of the variable nodes updates the respective LLR value therein, generates output messages for the respective check nodes, and transmits these messages via the corresponding message paths in the bipartite graph. The information in the transmitted messages may include the values of log ($Pr(c_i=0|m_j)/Pr(c_i=1|m_j)$), where $m_j$ denotes the set of input messages received by the i-th variable node. Other pertinent information may be communicated as well, as known in the art.

At step 406, each processor of a check node in the bipartite graph processes its input messages received via the corresponding message paths from the respective variable nodes. Based on the received input messages, each of the processors of the check nodes generates output messages for the respective processors of the variable nodes and transmits these messages via the corresponding message paths in the bipartite graph. The information in the transmitted messages may include the values of log (Pr(check satisfied|$M_j$)/Pr(check not satisfied|$M_j$)), where $M_j$ denotes the set of input messages received by the j-th check node. Other pertinent information may be communicated as well, as known in the art.

At step 408, decoder 144 checks an iteration-stopping criterion. In various embodiments, the iteration-stopping criterion may be satisfied when a prescribed maximum number of iterations have been performed or when $c'H^T(C)=0$, where is c' is a tentatively decoded codeword, and $H^T(C)$ is the transposed parity check matrix of the block error-correction code C (e.g., see Eq. (4)). In some embodiments, one or more alternative and/or additional stopping conditions can also be used. If the iteration-stopping criterion is not satisfied, then the processing of method 400 is directed back to step 404. If the iteration-stopping criterion is satisfied, then the processing of method 400 is directed to step 410.

At step 410, the sign bits of the current LLR values stored in the variable nodes corresponding to the syndrome bits $(s_1, \ldots, s_r)$ of the quantum stabilizer code Q (e.g., in nodes $310_1$-$310_4$ in bipartite graph 300, FIG. 3) are read out from the processors of the variable nodes and presented to quantum-state recovery circuit 148 as the most-probable syndrome vector $S=(s_1, \ldots, s_r)$. As already indicated above, quantum-state recovery circuit 148 uses the received syndrome vector S to generate an appropriate stimulus for correcting an error (if any) in the entangled quantum state held in qubit buffer 134.

Additional examples of message-passing decoding algorithms and corresponding circuits that might be useful for certain embodiments of decoder 144 are disclosed, e.g., in U.S. Pat. Nos. 8,327,215, 7,805,654, 7,793,201, 7,676,734, 7,519,898, and 7,373,581, all of which are incorporated herein by reference in their entirety. One of ordinary skill in the art will understand how to make and use various alternative embodiments of decoder 144 and method 400 based on these patents. Also note that, in the pertinent literature, some message-passing decoding algorithms that might be suitable for use in decoder 144 may be referred to as sum-product algorithms or belief-propagation algorithms.

It should be recognized that the use of some block error-correction codes C may result in better performance for memory system 100 than the use of others. Some of the better-performing block error-correction codes C can be constructed using a sparse (e.g., low-density) generator matrix $G(C)=[L_r|P]$ (also see Eq. (3)). For the generator matrix G(C) to be sparse, the corresponding parity-bit generator sub-matrix P needs to be sparse as well. For a sparse P, a representative parity bit, $p_j=s_{i1}+s_{i2}+\ldots+s_{it}$, is a sum of a relatively small number (t) of syndrome bits, where t<<r. This property also means that the binary vector $f_j$ ($=g_{i1}+g_{i2}+\ldots+g_{it}$) corresponding to the block error-correction code C has a relatively small weight, $wt(f_j)$ (also see Eqs. (2) and (6)). The latter statement is true due to the following property of the weights:

$$wt(f_j) \le wt(g_{i1})+wt(g_{i2})+\ldots+wt(g_{it}) \quad (10)$$

In one embodiment, the above-described block error-correction code C having a sparse generator matrix G(C) can be a low-density generator-matrix (LDGM) code. LDGM codes are a subfamily of LDPC codes. In an alternative embodiment, the quantum stabilizer code used in memory system 100 can be a first LDPC code, while the block error-correction code C is a second LDPC code different from the first LDPC code. In one embodiment, each column in generator matrix G(C) has a weight that is smaller than 10% of (N−r).

Eq. (10) and Eq. (8) imply that a block error-correction code C having a sparse parity-bit generator sub-matrix P has relatively small values of $P_{err}(f_j)$. The relatively small values of $P_{err}(f_j)$ may further relatively high accuracy of syndrome measurements in the corresponding embodiment of syndrome-measurement circuit 140 (FIG. 1).

According to an embodiment of the disclosure, a block error-correction code C having a sparse parity-bit generator sub-matrix P may be improved or optimized for use in memory system 100 using an EXIT-function approach generally outlined, e.g., in U.S. Pat. Nos. 7,251,769 and 7,751,491, both of which are incorporated herein by reference in their entirety. In particular, the EXIT-function approach may be used to formulate an optimization problem, the solution of which can be used by the designer of memory system 100 to construct a block error-correction code C that is relatively optimal for a specific embodiment of memory system 100 under design. An example formulation of the optimization problem, the solution of which can be used to construct the block error-correction code C for use in memory system 100, is disclosed in the above-cited U.S. patent application Ser. No. 13/912,654 by Alexei Ashikhmin. An example method of constructing the block error-correction code C by solving the formulated optimization problem is also disclosed in the above-cited U.S. patent application Ser. No. 13/912,654 by Alexei Ashikhmin.

A sparse binary matrix is a matrix populated primarily with zeros. By contrast, if a larger number of elements are ones, then the matrix is referred to as a dense matrix. The fraction of zero elements (non-zero elements) in the total number of elements in a matrix is called the sparsity (density) of the matrix. The sparsity and density values can be presented as absolute fractional values (in the range between 0 and 1) or as percentages.

In one embodiment, the parity-bit generator sub-matrix P has a density that is smaller than about 0.4 (or 40%). In a possible embodiment, the parity-bit generator sub-matrix P has a density that is between about 0.05 (or 5%) and about 0.25 (or 25%). In yet another possible embodiment, the parity-bit generator sub-matrix P has a density that is smaller than about 0.1 (or 10%).

According to an example embodiment disclosed above in reference to FIGS. 1-4, provided is an apparatus (e.g., 100, FIG. 1) comprising: a register (e.g., 134, FIG. 1) configured to store a coded entangled qubit state generated using a quantum stabilizer code (e.g., the quantum stabilizer code Q); a measurement circuit (e.g., 140, FIG. 1) configured to perform a redundant measurement of a set of syndrome values corresponding to the coded entangled qubit state, wherein the redundant measurement is performed based on a block error-correction code (e.g., the block error-correction code C); an erasure-value generator (e.g., 142, FIG. 1) configured to generate a set of erasure values; and a decoder (e.g., 144, FIG. 1) configured to determine a most probable syndrome vector (e.g., $S=(s_1, s_2, \ldots, s_r)$) corresponding to the coded entangled qubit state using the block error-correction code and the redundant measurement of the set of syndrome values, and further configured to apply the set of erasure values generated by the erasure-value generator to a set of variable nodes (e.g., $310_2$, $310_4$, FIG. 3) not configured to receive a measured syndrome value from the measurement circuit.

In some embodiments of the above apparatus, the apparatus further comprises a state-recovery circuit (e.g., 148, FIG. 1) configured to correct an error in the coded entangled qubit state based on the most probable syndrome vector determined by the decoder.

In some embodiments of any of the above apparatus, the state-recovery circuit is further configured to: determine, based on the most probable syndrome vector, an error operator corresponding to a probable error in the coded entangled qubit state; and process the coded entangled qubit state based on the error operator in a manner that corrects the probable error therein.

In some embodiments of any of the above apparatus, the apparatus further comprises a qubit array (e.g., 110, FIG. 1) configured to store a plurality of coded entangled qubit states, wherein the apparatus is configured to: transfer a selected coded entangled qubit state from the qubit array to the register; and transfer the selected coded entangled qubit state from the register to the qubit array in response to modifying the selected entangled qubit state based on the error operator.

In some embodiments of any of the above apparatus, the measurement circuit comprises: a first set of measurement modules (e.g., $210_1$-$210_2$, FIG. 2A) coupled to the register, wherein each measurement module in the first set is configured to measure a respective syndrome value corresponding to the coded entangled qubit state based on a respective one of first binary vectors (e.g., $g_j$, Eq. (1)), each of said first binary vectors being a generator of the quantum stabilizer code; and a second set of measurement modules (e.g., $210_3$-$210_{10}$, FIG. 2A) coupled to the register, wherein each measurement module in the second set is configured to measure a respective parity value corresponding to the coded entangled qubit state based on a respective one of second binary vectors (e.g., $f_j$, Eq. (6)), wherein each parity value is related to a respective subset of syndrome values of the quantum stabilizer code as defined by the block error-correction code.

In some embodiments of any of the above apparatus, a total number (e.g., r–L) of the measurement modules in the first set is smaller than a total number (e.g., r) of generators of the quantum stabilizer code.

In some embodiments of any of the above apparatus, a total combined number (e.g., N–L) of the measurement modules in the first and second sets is smaller than a codeword length (e.g., N) of the block error-correction code.

In some embodiments of any of the above apparatus, a measurement module in the first set comprises a respective soft-output detector (e.g., 212, FIG. 2B) configured to generate the respective syndrome value as a log-likelihood-ratio (LLR) value; and a measurement module in the second set comprises a respective soft-output detector (e.g., 212, FIG. 2C) configured to generate the respective parity value as an LLR value.

In some embodiments of any of the above apparatus, the decoder is configured to determine the most probable syndrome vector by executing a message-passing decoding algorithm corresponding to the block error-correction code; and the decoder is configured to initialize (e.g., 402, FIG. 4) said message-passing decoding algorithm using the LLR values generated by the measurement modules and further using the set of erasure values generated by the erasure-value generator.

In some embodiments of any of the above apparatus, a measurement module in the measurement circuit comprises: a sequence of quantum gates (e.g., M, H, FIGS. 2B-2C) connected to the register and configured to process a reference multi-qubit state by coupling the coded entangled qubit state to the reference multi-qubit state; and a logic circuit (e.g., 212, FIGS. 2B-2C) configured to estimate a syndrome value or a parity value corresponding to the coded entangled qubit state from measurements on the processed reference multi-qubit state performed by the sequence of quantum gates.

In some embodiments of any of the above apparatus, the logic circuit is configured to: estimate a respective binary syndrome sub-value or a respective binary parity sub-value from a measurement on individual qubits of the processed reference multi-qubit state; and the circuit comprises a multi-input XOR gate configured to process said binary sub-values to estimate the syndrome value or the parity value.

In some embodiments of any of the above apparatus, the logic circuit comprises a soft-output detector configured to generate a soft estimate of the syndrome value or of the parity value.

In some embodiments of any of the above apparatus, the decoder is configured to determine the most probable syndrome vector by executing a decoding algorithm corresponding to the block error-correction code.

In some embodiments of any of the above apparatus, the decoder is configured to initialize (e.g., 402, FIG. 4) said decoding algorithm using LLR values generated by the measurement circuit during the redundant measurement and further using the set of erasure values generated by the erasure-value generator.

In some embodiments of any of the above apparatus, the decoder is configured to use the set of erasure values generated by the erasure-value generator as an initial approximation for punctured syndrome bits of the most probable syndrome vector.

In some embodiments of any of the above apparatus, the decoder is configured to use the set of erasure values generated by the erasure-value generator to construct an initial approximation of a codeword corresponding to the coded entangled qubit state, said codeword being a codeword of the block error-correction code.

In some embodiments of any of the above apparatus, the decoder is further configured to use, in the initial approximation of the codeword corresponding to the coded entangled qubit state, LLR values generated by the measurement circuit during the redundant measurement.

According to another example embodiment disclosed above in reference to FIGS. 1-4, provided is a method of mitigating loss of fidelity of coded entangled qubit states stored in a memory system (e.g., 100, FIG. 1), the method comprising the steps of: generating a coded entangled qubit state using a quantum stabilizer code (e.g., the quantum stabilizer code Q); performing a redundant measurement of a set of syndrome values corresponding to the coded entangled qubit state, wherein the redundant measurement is performed based on a block error-correction code (e.g., the block error-correction code C); generating a set of erasure values; and determining a most probable syndrome vector (e.g., $S=(s_1, s_2, \ldots, s_r)$) corresponding to the coded entangled qubit state using the block error-correction code and based on the set of erasure values and the redundant measurement of the set of syndrome values.

In some embodiments of the above method, the set of erasure values is used to construct an initial approximation of a codeword corresponding to the coded entangled qubit state, said codeword being a codeword of the block error-correction code.

In some embodiments of any of the above methods, the step of determining comprises applying a set of erasure values to a set of variable nodes not configured to receive a measured syndrome value from the measurement circuit.

In some embodiments of any of the above methods, the initial approximation of the codeword includes LLR values generated during the redundant measurement of the set of syndrome values corresponding to the coded entangled qubit state.

While this invention has been described with reference to illustrative embodiments, this description is not intended to be construed in a limiting sense. Various modifications of the described embodiments, as well as other embodiments of the invention, which are apparent to persons skilled in the art to which the invention pertains are deemed to lie within the principle and scope of the invention as expressed in the following claims.

Some embodiments may be implemented as circuit-based processes, including possible implementation on a single integrated circuit.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled or referred-to as "processors," "controllers," "decoders," and "logic circuits" may be provided through the use of dedicated hardware as well as hardware capable of executing software in association with appropriate software. Moreover, explicit use of these terms should not be construed to refer exclusively to hardware capable of executing software, and may implicitly include, without limitation, digital signal processor (DSP) hardware, application specific integrated circuit (ASIC), field programmable gate array (FPGA), read only memory (ROM) for storing software, random access memory (RAM), and non volatile storage. Other hardware, conventional and/or custom, may also be included.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising:
   a register configured to store a coded entangled qubit state generated using a quantum stabilizer code;
   a measurement circuit configured to perform a redundant measurement of a set of syndrome values corresponding to the coded entangled qubit state, wherein the redundant measurement is performed based on a block error-correction code;
   an erasure-value generator configured to generate a set of erasure values; and
   a decoder configured to determine a probable syndrome vector corresponding to the coded entangled qubit state using the block error-correction code and the redundant measurement of the set of syndrome values, and further configured to apply the set of erasure values generated by the erasure-value generator to a set of variable nodes not configured to receive a measured syndrome value from the measurement circuit.

2. The apparatus of claim 1, further comprising a state-recovery circuit configured to correct an error in the coded entangled qubit state based on the probable syndrome vector determined by the decoder.

3. The apparatus of claim 2, wherein the state-recovery circuit is further configured to:
   determine, based on the probable syndrome vector, an error operator corresponding to a probable error in the coded entangled qubit state; and
   process the coded entangled qubit state based on the error operator in a manner that corrects the probable error therein.

4. The apparatus of claim 3, further comprising a qubit array configured to store a plurality of coded entangled qubit states, wherein the apparatus is configured to:

transfer a selected coded entangled qubit state from the qubit array to the register; and transfer the selected coded entangled qubit state from the register to the qubit array in response to modifying the selected entangled qubit state based on the error operator.

5. The apparatus of claim 1, wherein the measurement circuit comprises:

a first set of measurement modules coupled to the register, wherein each measurement module in the first set is configured to measure a respective syndrome value corresponding to the coded entangled qubit state based on a respective one of first binary vectors, each of said first binary vectors being a generator of the quantum stabilizer code; and a second set of measurement modules coupled to the register, wherein each measurement module in the second set is configured to measure a respective parity value corresponding to the coded entangled qubit state based on a respective one of second binary vectors, wherein each parity value is related to a respective subset of syndrome values of the quantum stabilizer code as defined by the block error-correction code.

6. The apparatus of claim 5, wherein a total number of the measurement modules in the first set is smaller than a total number of generators of the quantum stabilizer code.

7. The apparatus of claim 6, wherein a total combined number of the measurement modules in the first set and the second set is smaller than a codeword length of the block error-correction code.

8. The apparatus of claim 5, wherein a total combined number of the measurement modules in the first set and second set is smaller than a codeword length of the block error-correction code.

9. The apparatus of claim 5, wherein:

a measurement module in the first set comprises a respective soft-output detector configured to generate the respective syndrome value as a log-likelihood-ratio (LLR) value; and a measurement module in the second set comprises a respective soft-output detector configured to generate the respective parity value as an LLR value.

10. The apparatus of claim 1, wherein the decoder is configured to determine the probable syndrome vector by executing a message-passing decoding algorithm corresponding to the block error-correction code; and wherein the decoder is configured to initialize said message-passing decoding algorithm using the set of erasure values generated by the erasure-value generator.

11. The apparatus of claim 1, wherein a measurement module in the measurement circuit comprises:

a sequence of quantum gates connected to the register and configured to process a reference multi-qubit state by coupling the coded entangled qubit state to the reference multi-qubit state; and a logic circuit configured to estimate a syndrome value or a parity value corresponding to the coded entangled qubit state from measurements on the processed reference multi-qubit state performed by the sequence of quantum gates.

12. The apparatus of claim 11, wherein the logic circuit is configured to:

estimate a respective binary syndrome sub-value or a respective binary parity sub-value from a measurement on individual qubits of the processed reference multi-qubit state; and the circuit comprises a multi-input XOR gate configured to process said binary sub-values to estimate the syndrome value or the parity value.

13. The apparatus of claim 11, wherein the logic circuit comprises a soft-output detector configured to generate a soft estimate of the syndrome value or of the parity value.

14. The apparatus of claim 1, wherein the decoder is configured to determine the probable syndrome vector by executing a decoding algorithm corresponding to the block error-correction code.

15. The apparatus of claim 14, wherein the decoder is configured to initialize said decoding algorithm using LLR values generated by the measurement circuit during the redundant measurement and further using the set of erasure values generated by the erasure-value generator.

16. The apparatus of claim 1, wherein the decoder is configured to use the set of erasure values generated by the erasure-value generator as an initial approximation for punctured syndrome bits of the probable syndrome vector.

17. The apparatus of claim 1, wherein the decoder is configured to use the set of erasure values generated by the erasure-value generator to construct an initial approximation of a codeword corresponding to the coded entangled qubit state, said codeword being a codeword of the block error-correction code.

18. The apparatus of claim 17, wherein the decoder is further configured to use, in the initial approximation of the codeword corresponding to the coded entangled qubit state, LLR values generated by the measurement circuit during the redundant measurement.

19. A method of mitigating loss of fidelity of coded entangled qubit states stored in a memory system, the method comprising:

performing a redundant measurement of a set of syndrome values corresponding to a coded entangled qubit state generated using a quantum stabilizer code, wherein the redundant measurement is performed using a measurement circuit corresponding to a block error-correction code; and determining a probable syndrome vector corresponding to the coded entangled qubit state using the block error-correction code and the redundant measurement of the set of syndrome values; and wherein the step of determining comprises applying a set of erasure values to a set of variable nodes not configured to receive a measured syndrome value from the measurement circuit.

20. The method of claim 19, wherein the step of determining further comprises using the set of erasure values to construct an initial approximation of a codeword corresponding to the coded entangled qubit state, said codeword being a codeword of the block error-correction code, wherein the initial approximation of the codeword includes LLR values generated during the redundant measurement of the set of syndrome values corresponding to the coded entangled qubit state.

* * * * *